United States Patent
Jaffe et al.

(10) Patent No.: US 9,385,022 B2
(45) Date of Patent: Jul. 5, 2016

(54) SILICON WAVEGUIDE ON BULK SILICON SUBSTRATE AND METHODS OF FORMING

(71) Applicant: GLOBALFOUNDRIES INC., Grand Cayman (KY)

(72) Inventors: Mark D. Jaffe, Shelburne, VT (US); Alvin J. Joseph, Williston, VT (US); Qizhi Liu, Lexington, MA (US); Anthony K. Stamper, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 24 days.

(21) Appl. No.: 14/283,984

(22) Filed: May 21, 2014

(65) Prior Publication Data
US 2015/0340273 A1 Nov. 26, 2015

(51) Int. Cl.
| | |
|---|---|
| H01L 21/76 | (2006.01) |
| H01L 21/762 | (2006.01) |
| H01L 29/06 | (2006.01) |
| G02B 6/134 | (2006.01) |
| G02B 6/136 | (2006.01) |
| G02B 6/132 | (2006.01) |
| G02B 6/12 | (2006.01) |
| G02B 6/122 | (2006.01) |

(52) U.S. Cl.
CPC .......... *H01L 21/76224* (2013.01); *G02B 6/122* (2013.01); *G02B 6/12004* (2013.01); *G02B 6/132* (2013.01); *G02B 6/136* (2013.01); *G02B 6/1347* (2013.01); *H01L 21/762* (2013.01); *H01L 29/06* (2013.01); *H01L 29/0649* (2013.01); *G02B 2006/12061* (2013.01)

(58) Field of Classification Search
CPC .................................. G02B 6/122; G02B 6/136
USPC .......................................................... 438/424
See application file for complete search history.

(56) References Cited

U.S. PATENT DOCUMENTS

| | | | |
|---|---|---|---|
| 6,575,641 | B2 | 6/2003 | Yamabayashi et al. |
| 7,590,326 | B2 | 9/2009 | Fincato et al. |
| 8,270,778 | B2 | 9/2012 | Hochberg et al. |
| 8,437,585 | B2 | 5/2013 | Na |
| 2004/0027030 | A1 | 2/2004 | Wang et al. |
| 2007/0210307 | A1* | 9/2007 | Hebras .............. H01L 21/76254 257/52 |

(Continued)

OTHER PUBLICATIONS

Sherwood-Droz et al., "Oxidized Silicon-On-Insulator (OxSOI) from bulk silicon; a new photonic platform", Mar. 15, 2010, vol. 18, No. 6, Optics Express.

(Continued)

*Primary Examiner* — Trung Q Dang
*Assistant Examiner* — Patricia Reddington
(74) *Attorney, Agent, or Firm* — Michael LeStrange; Hoffman Warnick LLC

(57) ABSTRACT

Various methods include: forming an optical waveguide in a bulk silicon layer, the optical waveguide including a set of shallow trench isolation (STI) regions overlying a silicon substrate region; ion implanting the silicon substrate to amorphize a portion of the silicon substrate; forming a set of trenches through the STI regions and into the underlying silicon substrate region; undercut etching the silicon substrate region under the STI regions through the set of trenches to form a set of cavities, wherein the at least partially amorphized portion of the silicon substrate etches at a rate less than an etch rate of the silicon substrate; and sealing the set of cavities.

17 Claims, 10 Drawing Sheets

(56) References Cited

U.S. PATENT DOCUMENTS

| | | | | |
|---|---|---|---|---|
| 2008/0317423 | A1* | 12/2008 | Stepanov | G02B 6/122 385/132 |
| 2010/0059822 | A1 | 3/2010 | Pinguet et al. | |
| 2010/0197107 | A1* | 8/2010 | Matsuzaki | H01L 21/0337 438/424 |
| 2011/0084047 | A1 | 4/2011 | Yeo et al. | |
| 2011/0158582 | A1 | 6/2011 | Su et al. | |

OTHER PUBLICATIONS

Chang et al., "Monolithic Silicon Waveguides in Bulk Silicon", IEEE, 2012.

* cited by examiner

SILICON WAVEGUIDE ON BULK SILICON SUBSTRATE AND METHODS OF FORMING

BACKGROUND

The subject matter disclosed herein relates to optical devices. More particularly, the subject matter relates to silicon-based optical devices.

As devices relying upon integrated circuits (ICs) have increased in complexity and functionality, those devices have required ever more dynamic ICs to meet the demands of those device users. IC photonic (optical) devices are conventionally built on silicon-on-insulator (SOI) substrates, and these SOI substrates have been used to build circuits capable of switching at these fast speeds. The SOI substrates include a buried oxide (BOx) substrate that enhances the efficiency of the optical properties in the device. The BOx substrate is conventionally a thick layer (e.g., approximately 2 micrometers), with a greater thickness than the transmitted wavelength of the light source (e.g., infra-red light source). This thickness allows for low-loss optical light transmission. However, SOI substrates (e.g., BOx substrates) can be expensive to procure, making them less practicable for use.

BRIEF DESCRIPTION

Various embodiments include waveguide field effect transistor (FET) structures and methods of forming such waveguide FET structures. One method includes: forming an optical waveguide in a bulk silicon layer, the optical waveguide including a set of shallow trench isolation (STI) regions overlying a silicon substrate region; ion implanting the silicon substrate to amorphize a portion of the silicon substrate; forming a set of trenches through the STI regions and into the underlying silicon substrate region; undercut etching the silicon substrate region under the STI regions through the set of trenches to form a set of cavities, wherein the amorphized portion of the silicon substrate etches at a rate less than an etch rate of the silicon substrate; and sealing the set of cavities.

A first aspect includes a method including: forming an optical waveguide in a bulk silicon layer, the optical waveguide including a set of shallow trench isolation (STI) regions overlying a silicon substrate region; ion implanting the silicon substrate to amorphize a portion of the silicon substrate; forming a set of trenches through the STI regions and into the underlying silicon substrate region; undercut etching the silicon substrate region under the STI regions through the set of trenches to form a set of cavities, wherein the amorphized portion of the silicon substrate etches at a rate less than an etch rate of the silicon substrate; and sealing the set of cavities.

A second aspect includes a method including: forming an optical waveguide in a bulk silicon layer, the optical waveguide including a set of shallow trench isolation (STI) regions overlying a silicon substrate region; forming a mask over the STI regions; ion implanting the silicon substrate to amorphize a portion of the silicon substrate, wherein the mask prevents amorphizing of the silicon substrate in a region underlying the mask; forming a set of trenches through the STI regions and into the underlying silicon substrate region; undercut etching the silicon substrate region under the STI regions through the set of trenches to form a set of cavities, wherein the amorphized portion of the silicon substrate etches at a rate less than an etch rate of the silicon substrate; and forming an oxide within the set of trenches and the set of cavities.

A third aspect includes a silicon waveguide structure having: a bulk silicon substrate; a set of air gaps contained within the bulk silicon substrate; an oxide liner lining each of the set of air gaps; a converted single crystalline silicon (Si) region overlying the set of air gaps; a set of shallow trench isolation (STI) regions overlying the set of air gaps; and a bulk silicon region overlying the converted single crystalline silicon (Si) region between the set of STI regions.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
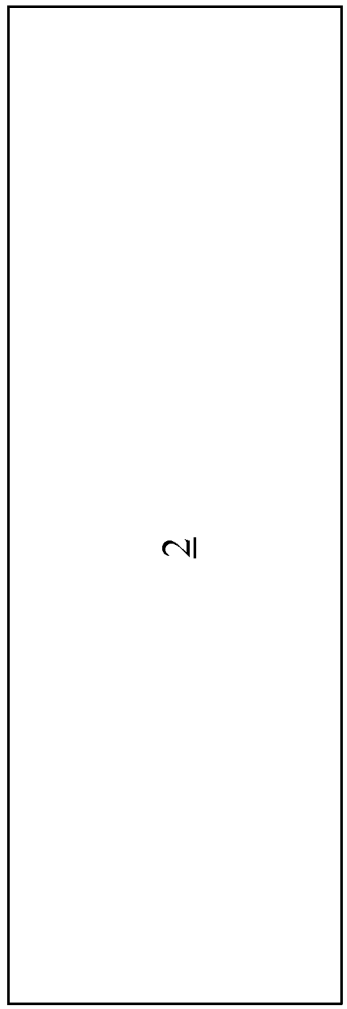
FIGS. 1-3 show cross-sectional views of a semiconductor structure undergoing processes according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to optical devices. More particularly, the subject matter relates to silicon-based optical devices.

As described herein, IC photonic (optical) devices that are conventionally built on silicon-on-insulator (SOI) substrates have been used to build circuits capable of switching at these fast speeds. The SOI substrates include a buried oxide (BOX) substrate that enables the efficiency of the optical properties in the device. The BOX layer is conventionally a thick layer (e.g., approximately 2 micrometers), with a greater thickness than the transmitted wavelength of the light source (e.g., infra-red light source). The optical properties of the BOX layer, and the designed optical waveguide structures including the aforementioned thickness value of the BOX layer, allows for low-loss optical light transmission. However, SOI substrates can be expensive to procure when compared with bulk Si substrates, increasing the cost of the technology based upon these SOI substrates.

In contrast to conventional IC optic devices with SOI (BOX) substrates, various devices disclosed herein are formed on bulk silicon substrates, thus reducing costs and complexity of manufacturing when compared with the conventional IC optic devices. Various particular embodiments include methods of forming IC optical devices.

In various embodiments described herein, an ion-implanted layer (e.g., ion-implanted silicon) is used as an etch stop during formation of a waveguide structure, which is distinct from prior attempts that utilized silicon germanium (SiGe) as an etch stop layer in this process. As noted herein, the etch rate in these implanted (ion implanted) regions is significantly less (slower) than in un-amorphized regions (e.g., of the same material), and these implanted regions can be later repaired by annealing. When compared with using SiGe as an etch stop layer in forming a waveguide, the process of using an amorphized (ion implanted) region as an etch stop layer can also be more selective, as the SiGe etch stop layer is traditionally epitaxially grown.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

FIG. 1 shows a schematic cross-sectional depiction of a bulk silicon layer 2. The bulk silicon layer 2, as indicated herein, can be formed of a bulk silicon, e.g., an undoped silicon material available in large quantities (bulk quantities), as is known in the art.

Figure 2:
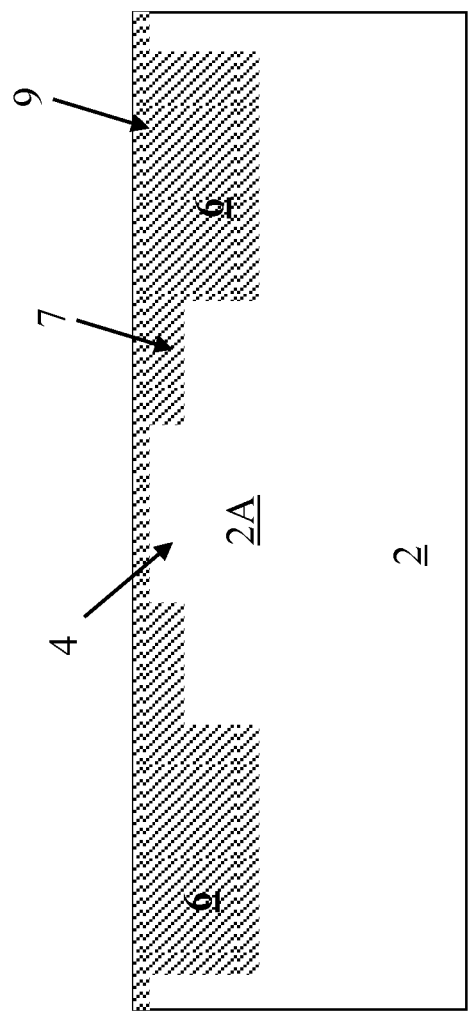

FIG. 2 shows a process of forming an optical (e.g., ridge) waveguide 4 in the bulk silicon layer 2, according to various embodiments. As shown, the optical (ridge) waveguide (or simply, waveguide) 4 can include a set of shallow trench isolation (STI) regions 6 overlying a silicon substrate region 2A within the bulk silicon layer 2. The optical (ridge) waveguide 4, including the STI regions, can be formed by conventional photolithography and etch processes, well known in the art of semiconductor/integrated circuit manufacturing.

According to various embodiments, the process of forming the STI regions 6 can include forming a (ridge) waveguide structure in each of the STI regions 6, where the (ridge) waveguide structure has a first portion 7 extending to a first depth (d1) in the bulk silicon layer 2, and a second portion 9 extending to a second depth (d2) in the bulk silicon layer 2, where the second depth (d2) is greater than the first depth (d1).

Figure 3:
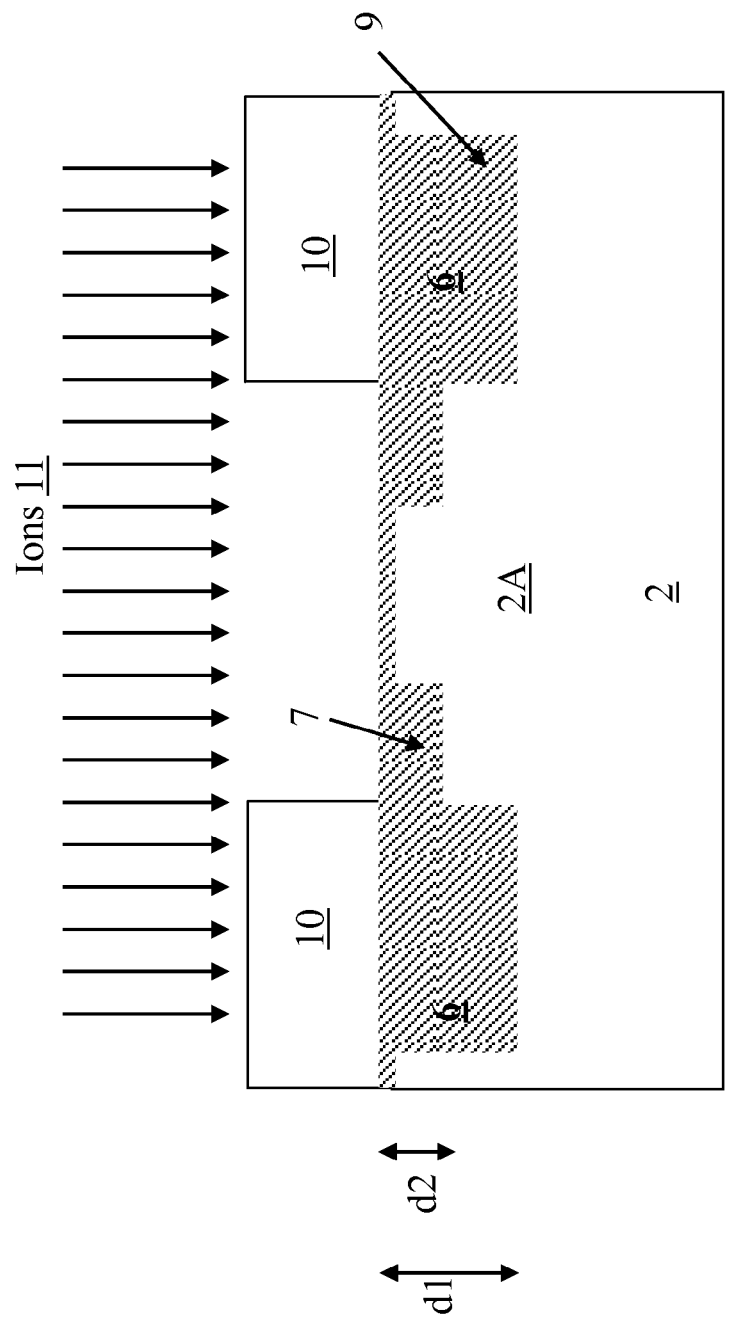

FIG. 3 shows an additional process of ion implanting the silicon substrate 2A to amorphize a portion 8 of the silicon substrate 2A, according to various embodiments. In various embodiments, the process of ion implanting of the silicon substrate 2A can include implanting the silicon substrate 2A with ions 11 including at least one of argon (Ar) ions, neon (Ne) ions, silicon (Si) ions, indium (In) ions, oxygen (O) ions, germanium (Ge) ions or boron (B) ions. According to various embodiments, the amorphized portion 8 of the silicon substrate 2A underlies the first portion 7 of the STI region 6, e.g., the portion having a lesser depth (d1) into the bulk silicon layer 2.

In some embodiments, as illustrated in FIG. 3, an additional process includes forming a mask 10 over the STI regions 6 prior to the ion implanting, to prevent ion implanting into areas of the silicon substrate 2A and the STI regions 6 obstructed by the mask 10. In various embodiments, the mask 10 can include a hard mask, and may be deposited, epitaxially grown, or otherwise formed over an upper surface of the bulk silicon layer 2.

Figure 4:
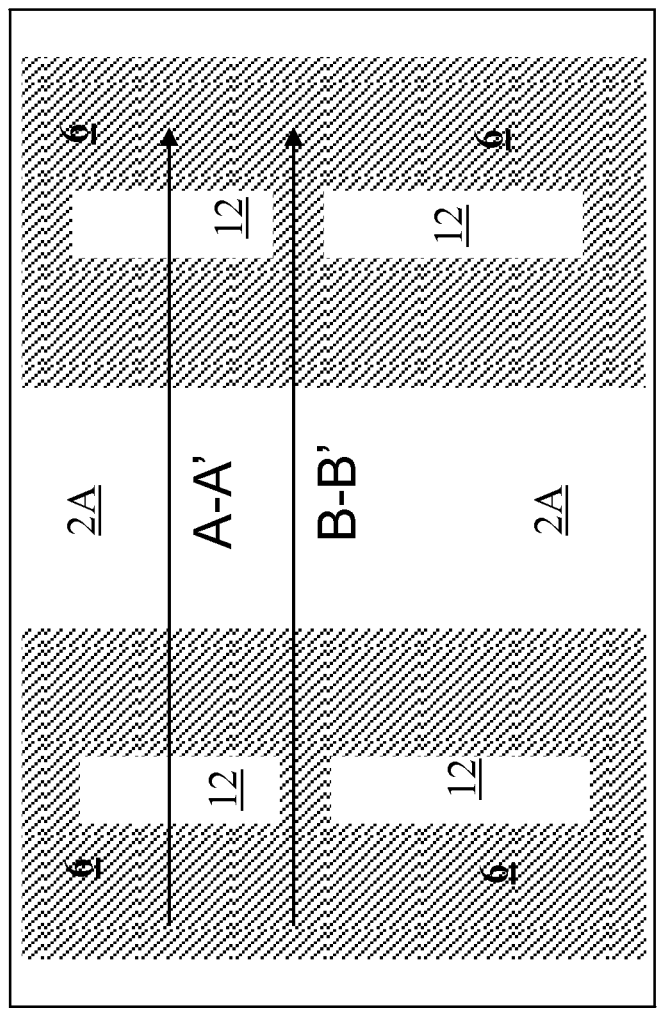
FIG. 4 shows a top view of the semiconductor structure of FIG. 3 undergoing an additional process according to various embodiments.
Figure 5A:
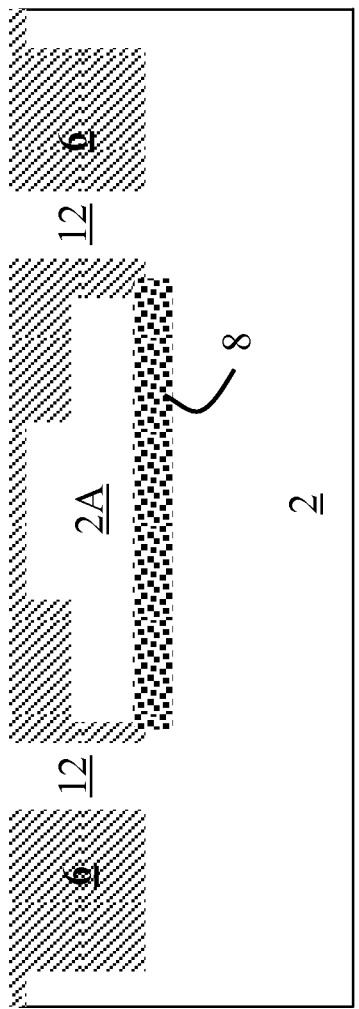
FIG. 5A shows a cross-sectional view of the semiconductor structure of FIG. 4, through line A-A', undergoing a process according to various embodiments.
Figure 5B:
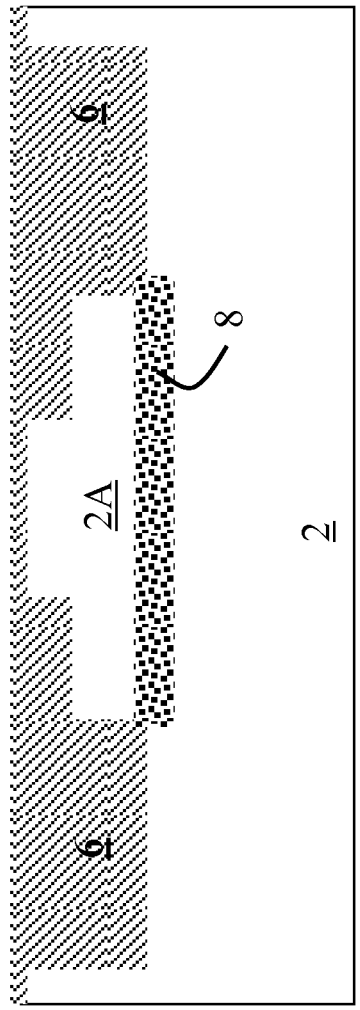
FIG. 5B shows a cross-sectional view of the semiconductor structure of FIG. 4, through line B-B', undergoing a process according to various embodiments.

FIG. 4 and FIGS. 5A-5B depict an additional process according to various embodiments. FIG. 4 shows a top view, and FIGS. 5A-5B show respective cross-sectional views of a structure illustrating the process of forming a set of trenches 12 through the STI regions 6 and into the underlying silicon substrate 2A. In some embodiments, as shown in FIG. 4 and FIGS. 5A-5B, an additional process can include removing the mask 10 after the ion implanting, e.g., by etching or using a conventional bath.

Figure 6A:
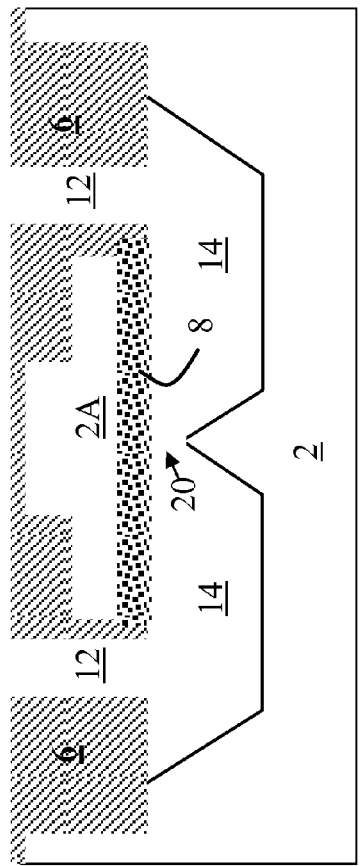
FIG. 6A shows a cross-sectional view of the semiconductor structure of FIG. 5A, through line A-A' shown in FIG. 4, undergoing a process according to various embodiments.
Figure 6B:
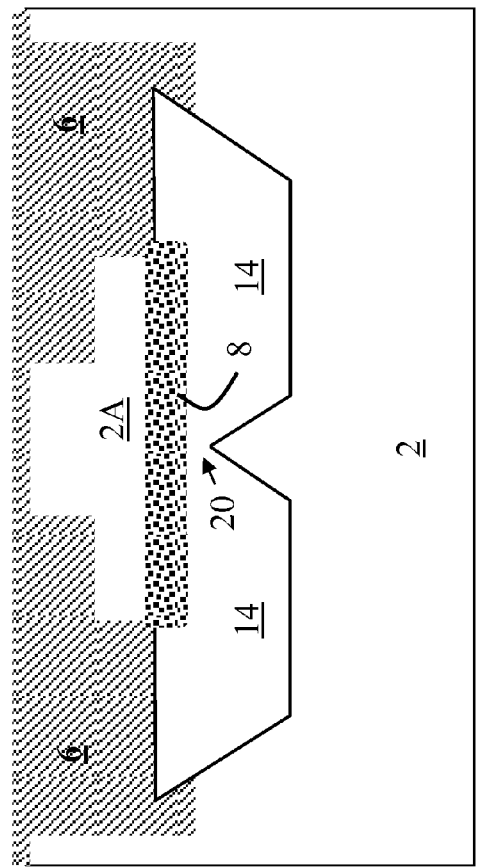
FIG. 6B shows a cross-sectional view of the semiconductor structure of FIG. 5B, through line B-B' shown in FIG. 4, undergoing a process according to various embodiments.

FIGS. 6A-6B show respective cross-sectional views through lines A-A' and B-B' (FIG. 4), illustrating an additional process according to various embodiments. This process can include undercut etching the silicon substrate region 2A under the STI regions 6 through the set of trenches 12 to form a set of cavities 14. In various embodiments, the undercut etching is performed using a reactive ion etching (RIE) technique.

In various embodiments, the undercut etching is performed using a wet chemical etch, e.g., ammonia hydroxide etching or potassium hydroxide etching. These wet chemical etches are crystalline-dependent, meaning that these etches have different speeds in different directions. The depth of the cavities 14 formed via the undercut etch described with reference to FIG. 4A and FIG. 4B is dictated by both: a) the depth of the cavities 14, as well as b) the width of the undercut etch.

In various embodiments, the amorphized portion 8 of the silicon substrate 2A etches at a rate less than an etch rate of the silicon substrate 2A (e.g., the un-amorphized portions of the silicon substrate 2A). That is, according to various embodiments, the amorphized portion 8 of the silicon substrate 2A resists etching (e.g., resists RIE etching) as compared with the un-amorphized portions of the silicon substrate 2A, allowing for selective etching underneath the STI regions 6.

Figure 7A:
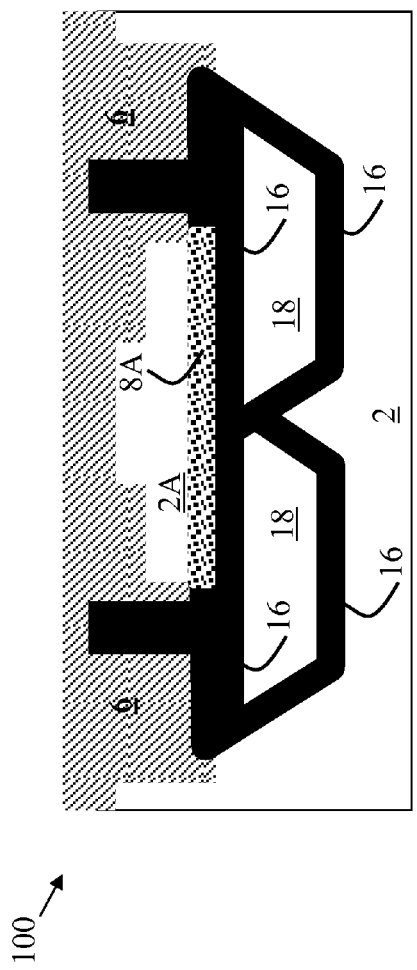
FIG. 7A shows a cross-sectional view of the semiconductor structure of FIG. 6A, through line A-A' shown in FIG. 4, undergoing a process according to various embodiments.
Figure 7B:
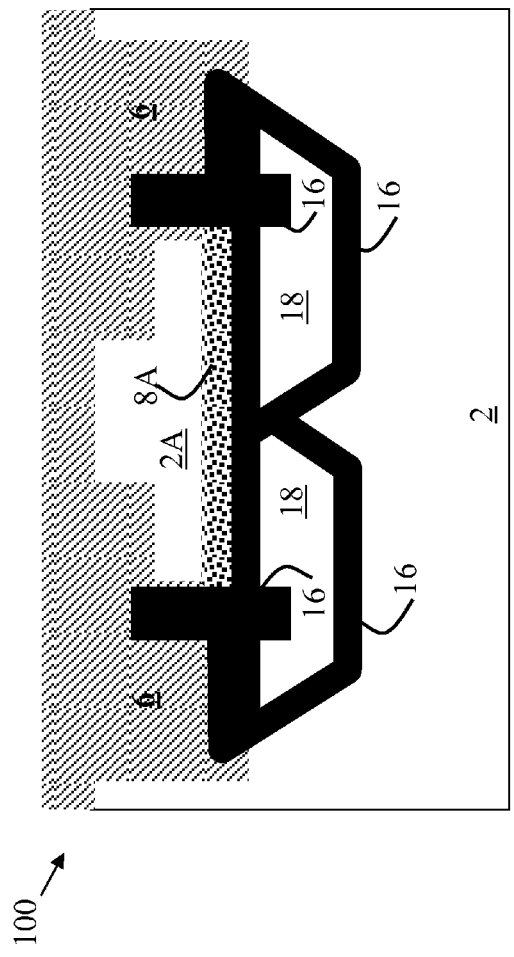
FIG. 7B shows a cross-sectional view of the semiconductor structure of FIG. 6B, through line B-B' shown in FIG. 4, undergoing a process according to various embodiments.

FIGS. 7A-7B show respective cross-sectional views through lines A-A' and B-B' (FIG. 4), illustrating an additional process according to various embodiments. This process can include sealing the set of cavities 14, e.g., by forming an oxide 16 within the set of cavities 14, and in some cases, within the set of trenches 12. In various embodiments, the oxide 16 is deposited to at least partially fill the set of cavities 14, and completely fill the set of trenches 12. According to some embodiments, the oxide can include silicon dioxide ($SiO_2$).

After sealing the set of cavities 14, air gaps 18 remain within the set of cavities 14. In various embodiments, the oxide 16 is formed (e.g., deposited) conformally, such that it adheres to surfaces and "builds" inward, leaving air gaps 18. A gap connection 20 is shown between adjacent air gaps 18 in adjacent cavities 14 (not labeled here due to fill from oxide 16).

In some embodiments, an additional process can include planarizing the oxide 16 extending above the upper surface of the bulk silicon 2, e.g., using a reverse mask planarization process.

As shown, FIGS. 7A and 7B illustrate a silicon waveguide structure 100 according to various embodiments, where the silicon waveguide structure 100 includes a bulk silicon substrate 2, a set of air gaps 18 contained within the bulk silicon substrate 2, and an oxide liner 16 lining each of the set of air gaps 18. The silicon waveguide structure 100 can also include a converted single crystalline silicon (Si) region 8A (converted from amorphized silicon 8, after annealing) overlying the set of air gaps 18, and a set of STI regions 6 overlying the set of air gaps 18. In some embodiments, the converted single crystalline Si region 8A can include a portion that is still amorphized and was not converted to single crystalline Si by annealing. In various embodiments, the set of STI regions 6 abut (contact, and sit adjacent to) the single crystalline Si region 8A. Between the set of STI regions 6, and overlying the single crystalline Si region 8A, is a bulk silicon region 2A, which acts as a waveguide for light (optical waveguide) travelling between the STI regions 6 and the oxide liner 16.

Figure 8A:
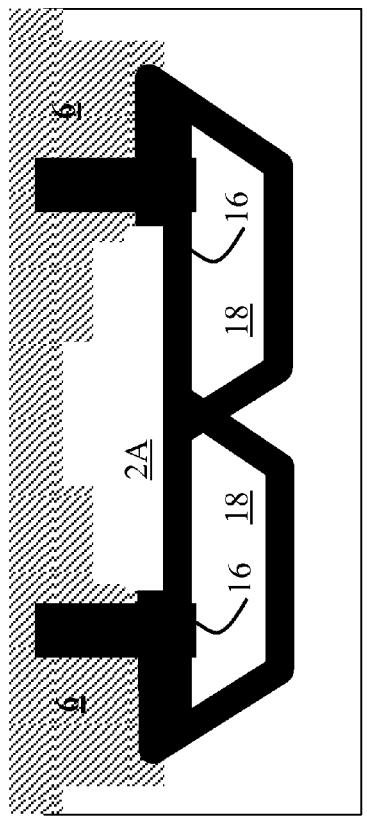
FIG. 8A shows a cross-sectional view of the semiconductor structure of FIG. 7A, through line A-A' shown in FIG. 4, undergoing a process according to various embodiments.
Figure 8B:
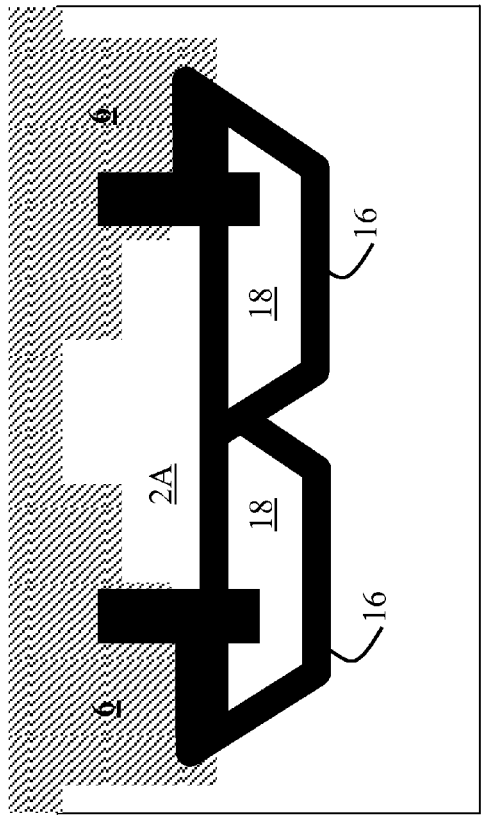
FIG. 8B shows a cross-sectional view of the semiconductor structure of FIG. 7B, through line B-B' shown in FIG. 4, undergoing a process according to various embodiments.
Figure 9:
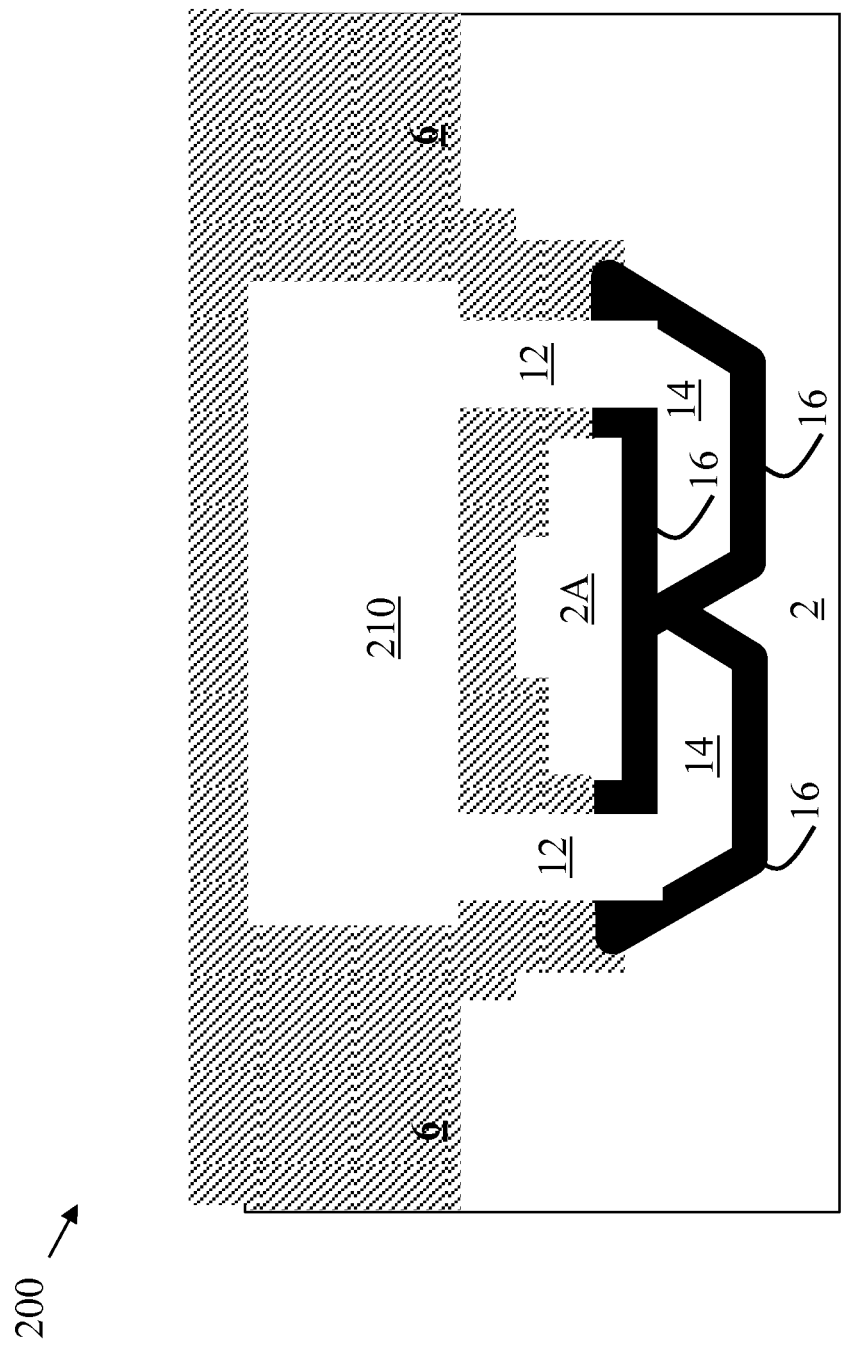
FIG. 9 shows a cross-sectional depiction of an alternative waveguide structure according to various embodiments.

FIGS. 8A-8B illustrate another embodiment, in which the silicon substrate region 2A is annealed, along with the STI regions 6, after sealing of the set of cavities 14. In this embodiment, the previously amorphized portion 8 of the silicon substrate region 2A can be at least partially re-grown (healed) by the annealing to form the single crystalline Si region 8A via solid phase regrowth. In various embodiments, an anneal is performed at approximately 400-800 degrees Celsius (in particular cases, around 500 degrees C.), for approximately 30 minutes to several hours FIG. 9 shows an alternative embodiment of a silicon waveguide structure 200, shown according to various embodiments. As shown, the silicon waveguide structure 200 can include an extended air gap 210 that spans between the set of cavities 14, through the trenches 12 and into a region overlying the optical ridge waveguide 4.

According to various other alternative embodiments, a process can include etching trenches (e.g., trenches 12) in a bulk Si substrate (bulk silicon layer 2) through the implant-amorphised region (e.g., amorphized silicon 8), e.g., either in the bulk Si region outside the STI region(s) (e.g., STI regions 6), for example, abutting it, or have some space from the STIs. Thereafter, form a spacer inside the trench, for example, by depositing a bi-layer of oxide and nitride followed by etching the nitride film, stopping on the oxide. This spacer is then used as an etch stop layer on the sidewall, together with the amorphised region (e.g., amorphized silicon 8) at the bottom of the trench, during an undercut etch of the bulk Si region to form an isolated Si region which is used as the optical waveguide.

Figure 10:
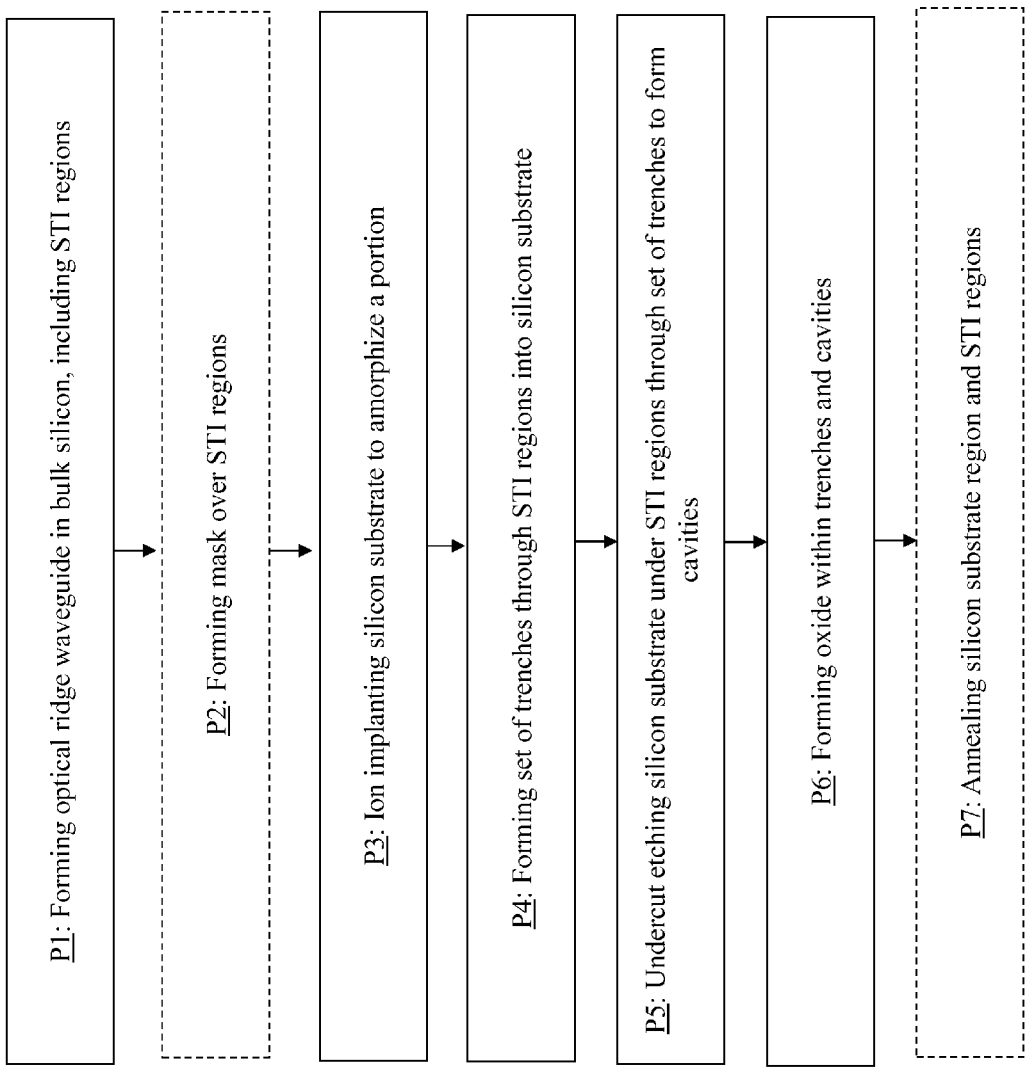
FIG. 10 shows a flow diagram illustrating processes according to various embodiments.

FIG. 10 shows a flow diagram illustrating a process according to various embodiments. Various sub-processes shown and described with respect to FIG. 10 can be performed as described herein with respect to FIGS. 1-4, 5A-5B, 6A-6B, 7A-7B, 8A-8B and 9. It is understood that these processes may be performed in the order indicated, but may also be performed in another or other orders according to various embodiments. According to some embodiments, a process can include:

Process P1: forming an optical ridge waveguide in a bulk silicon layer, the optical ridge waveguide including a set of shallow trench isolation (STI) regions overlying a silicon substrate region;

Process P2: forming a mask over the STI regions (optional in some embodiments, indicated in phantom);

Process P3: ion implanting the silicon substrate to amorphize a portion of the silicon substrate, wherein the mask prevents amorphizing of the silicon substrate in a region underlying the mask;

Process P4: forming a set of trenches through the STI regions and into the underlying silicon substrate region;

Process P5: undercut etching the silicon substrate region under the STI regions through the set of trenches to form a set of cavities, wherein the at least partially amorphized portion of the silicon substrate etches at a rate less than an etch rate of the silicon substrate; and Process P6: forming an oxide within the set of trenches and the set of cavities.

In some cases, as noted herein, an additional process can include:

Process P7: annealing the silicon substrate region and the STI regions after the sealing of the set of cavities.

The silicon (optical) waveguide structure 100 of FIGS. 7A-7B can provide significant cost benefits when compared with conventional SOI waveguide structures. As the silicon (optical) waveguide 100 is built on a bulk silicon substrate 2, material costs can be significantly less than conventional SOI waveguide structures, and further, the silicon (optical) waveguide 100 can also allow for enhanced flexibility in integrating other devices including complementary-metal-oxide semiconductor field-effect transistors (CMOS FETs) with the silicon waveguide 100 when compared to convention SOI waveguide structures.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method comprising:
    forming an optical waveguide in a bulk silicon layer, the optical waveguide including a set of shallow trench isolation (STI) regions overlying a silicon substrate region;
    ion implanting the silicon substrate to amorphize a portion of the silicon substrate;
    forming a set of trenches through the STI regions and into the underlying silicon substrate region,
    wherein the forming of the set of STI regions includes forming a waveguide structure including the STI regions, the waveguide structure having a first portion extending to a first depth in the bulk silicon layer, and a second portion extending to a second depth in the bulk silicon layer, the second depth being greater than the first depth;
    undercut etching the silicon substrate region under the STI regions through the set of trenches to form a set of cavities, wherein the amorphized portion of the silicon substrate etches at a rate less than an etch rate of the silicon substrate,
    wherein the amorphized portion underlies the waveguide structure; and
    sealing the set of cavities.

2. The method of claim 1, further comprising annealing the silicon substrate region and the STI regions after the sealing of the set of cavities.

3. The method of claim 1, further comprising:
    forming a mask over the STI regions prior to the ion implanting; and
    removing the mask after the ion implanting.

4. The method of claim 1, wherein the sealing of the set of trenches includes:
    forming an oxide within the set of trenches and the set of cavities.

5. The method of claim 4, wherein the forming of the oxide includes depositing the oxide to at least partially fill the set of cavities and completely fill the set of trenches.

6. The method of claim 1, wherein the ion implanting includes implanting with at least one of argon (Ar) ions, neon (Ne) ions, silicon (Si) ions, indium (In) ions, oxygen (O) ions, germanium (Ge) ions, or boron (B) ions.

7. A method comprising:
    forming an optical waveguide in a bulk silicon layer, the optical waveguide including a set of shallow trench isolation (STI) regions overlying a silicon substrate region;
    forming a mask with an opening over the STI regions;
    ion implanting the silicon substrate to amorphize a portion of the silicon substrate, wherein the mask prevents amorphizing of the silicon substrate in a region underlying the mask;
    forming a set of trenches through the STI regions and into the underlying silicon substrate region;
    undercut etching the silicon substrate region under the STI regions through the set of trenches to form a set of cavities, wherein the amorphized portion of the silicon substrate etches at a rate less than an etch rate of the silicon substrate, wherein the undercut etching includes performing a wet chemical etch; and
    forming an oxide within the set of trenches and the set of cavities.

8. The method of claim 7, further comprising annealing the silicon substrate region and the STI regions after the sealing of the set of cavities.

9. The method of claim 7, wherein the forming of the set of the trenches includes etching through the STI regions and into the underlying silicon substrate adjacent to the amorphized portion of the silicon substrate.

10. The method of claim 7, wherein the forming of the oxide includes depositing the oxide to at least partially fill the set of cavities and completely fill the set of trenches.

11. The method of claim 7, wherein the ion implanting includes implanting with at least one of argon (Ar) ions, neon (Ne) ions, silicon (Si) ions, indium (In) ions, oxygen (O) ions, germanium (Ge) ions, or boron (B) ions.

12. The method of claim 7, wherein the forming of the set of STI regions includes forming a waveguide structure including the STI regions, the waveguide structure having a first portion extending to a first depth in the bulk silicon layer, and a second portion extending to a second depth in the bulk silicon layer, the second depth being greater than the first depth.

13. The method of claim 12, wherein the amorphized portion underlies the waveguide structure.

14. The method of claim 1, wherein the amorphized portion underlies only the first portion of the waveguide structure extending to the first depth in the bulk silicon layer.

15. The method of claim 1, wherein the undercut etching includes performing a wet chemical etch.

16. The method of claim 13, wherein the amorphized portion underlies only the first portion of the waveguide structure extending to the first depth in the bulk silicon layer.

17. A method comprising:
    forming an optical waveguide in a bulk silicon layer, the optical waveguide including a set of shallow trench isolation (STI) regions overlying a silicon substrate region;
    ion implanting the silicon substrate to amorphize a portion of the silicon substrate;
    forming a set of trenches through the STI regions and into the underlying silicon substrate region;
    undercut etching the silicon substrate region under the STI regions through the set of trenches to form a set of cavities, wherein the amorphized portion of the silicon substrate etches at a rate less than an etch rate of the silicon substrate, wherein the undercut etching includes performing a wet chemical etch; and
    sealing the set of cavities.

* * * * *